MULTICELL TRANSISTOR

Filed Aug. 12, 1965

INVENTORS.
MICHAEL O. PRELETZ,
KENNETH O. TILLUNG,

BY THEIR ATTORNEYS
Spensley & Horn.

3,336,508
MULTICELL TRANSISTOR
Michael O. Preletz, Santa Monica, and Kenneth Orlin Tillung, Torrance, Calif., assignors to TRW Semiconductors, Inc., Lawndale, Calif., a corporation of Delaware
Filed Aug. 12, 1965, Ser. No. 479,240
7 Claims. (Cl. 317—101)

This invention relates to semiconductor devices and more particularly to a multiple cell transistor structure.

The parallel connection of identical electrical translating elements is a common technique for increasing the power handling capabilities of an electronic circuit. For example, the power output of a transistor amplifier stage may be increased by adding one or more transistors in shunt with a given transistor. Although commonly used in low and intermediate frequency applications, this technique has heretofore proven quite difficult of application at high frequencies due to the phenomenon known as "current hogging." In circuitry operating at radio frequencies on the order of 70 to 1000 megacycles or greater, the lengths of the electrical interconnecting leads in the circuit approach the operating wave length, thereby resulting in significant differences in the resistance of various current paths. For example, it has been found that in high frequency applications involving parallel connected transistors slight differences in the configuration of the transistor base leads may result in one transistor carrying practically all of the current, while the other parallel connected transistors are literally inoperative. The present invention is directed toward a transistor structure wherein a plurality of substantially identical transistors can be connected in parallel with identical base lead configurations, thereby eliminating current hogging at high frequencies.

The present invention consists of a multiple cell transistor structure formed in a single body of semiconductor material, the bulk of the semiconductor material being either a common collector or emitter electrode with the remaining electrodes of each transistor being diffused into the upper surface of the semiconductor body to thereby form an individual transistor "cell." The surface regions defining the transistor cells are substantially identical and elongate in configuration, and are equidistantly disposed in radial alignment to form a circular array. A concentric metallic ring interconnects the base electrodes of the transistor cells. A metallic disc at the center of the circular array is provided for establishing electrical contact to an external lead. A plurality of identical linear metallic strips are provided to interconnect the base feeding ring with the central contact disc, each of the interconnecting strips extending radially from the central disc portion to a point on the base feeder ring equidistant from two adjacent transistor cells. In practice, the base feeding ring, central disc and interconnecting strips can be formed as an integral structure, typically through the use of a metalizing technique. The base feeder ring contacts each of the transistor cells at its innermost end portion, whereas a concentric emitter feeder ring is utilized to establish contact to the emitter regions at the outermost end of each transistor cell. Thus, a multiple cell transistor structure is provided wherein the base interconnections are symmetrical and of identical configuration so that the D.C. and R.F. current paths to the base of each transistor are identical. Many transistor cells can be formed on a single semiconductor wafer and any predetermined number of the cells interconnected in parallel by forming the proper pattern of interconnecting strips.

Accordingly, it is an object of the present invention to provide an improved transistor structure.

It is also an object of the present invention to provide an improved technique for interconnecting transistors in parallel.

It is another object of the present invention to provide an improved multiple cell transistor structure.

It is a further object of the present invention to provide an improved transistor structure suitable for increasing the power handling capabilities of the transistorized circuit.

It is yet another object of the present invention to provide an improved multiple cell transistor structure suitable for use at high frequencies.

It is a still further object of the present invention to provide a transistor structure wherein a plurality of identical transistors can be selectively interconnected to increase power handling ability.

It is also an object of the present invention to provide an improved multiple cell transistor structure wherein the transistor cells are connected in parallel, the structure being suitable for use at high frequencies.

It is still another object of the present invention to provide an improved multiple cell transistor structure wherein the base electrodes of the transistors are connected to an electrical contact by a symmetrical pattern of identical conductive paths.

The novel features which are believed to be characteristic of the present invention, together with further objects and advantages thereof, will be better understood from the following description in which the invention is illustrated by way of example. It is to be expressly understood, however, that the description is for the purpose of illustration only and that the true spirit and scope of the invention is defined by the accompanying claims.

Figures 1, 2, 3, 4, 5, 6:
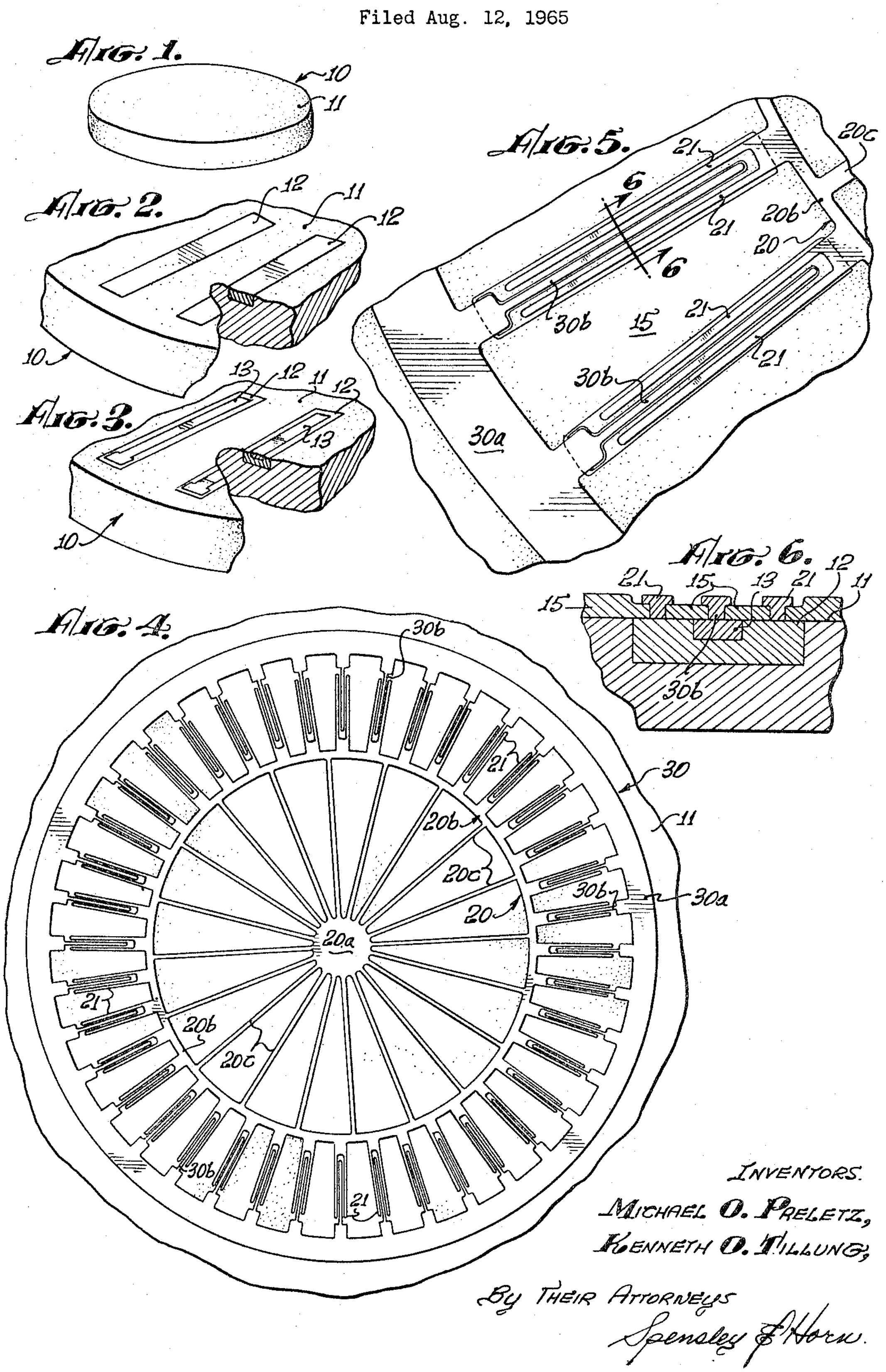
FIGURE 1 is a perspective view of a semiconductor wafer.
FIGURE 2 is an enlarged perspective view, partially cut away, of a portion of the wafer of FIGURE 1 during an early stage of the fabrication of a multiple cell transistor structure.
FIGURE 3 is a perspective view of the wafer portion of FIGURE 2 during a later stage of fabrication.
FIGURE 4 is a plan view of a portion of the wafer of FIGURE 1, showing a completed multiple cell transistor structure.
FIGURE 5 is an enlarged plan view of a portion of the completed structure of FIGURE 4.
FIGURE 6 is a further enlarged view taken along the line 6—6 of FIGURE 5.

Turning now to the drawing, in FIGURE 1 there is shown a semiconductor crystal wafer, generally indicated by the reference numeral 10, suitable for use in fabricating the present invention transistor structure. The crystal wafer 10 is of a predetermined conductivity type material, such as P type silicon, for example. The wafer 10 has a planar upper surface 11 into predetermined areas of which are introduced active impurity atoms in accordance with well-known masking and diffusion techniques.

First, a circular array of equidistantly spaced N type surface regions 12 are diffused into the upper surface of the wafer, these N type surface regions being of elongate rectangular configuration and disposed in radial alignment. The interfaces between the N type surface regions and the surrounding bulk material form PN junctions. The illustrated embodiment depicts a circular array of forty surface regions, although any number of such regions can be formed. An enlarged view of a peripheral portion of the wafer 10, subsequent to the diffusion of the N type surface regions 12, is shown in FIGURE 2.

Next, a P type surface region 13 is diffussed into each one of the N type surface regions 12, the surface regions 13 being island type regions which are completely surrounded by the N type regions 12. The diffusion depth of the surface regions 13 are not as deep as those of the surface regions 12, as can be seen in FIGURE 3 of the drawing, whereby the surface regions 13 are completely contained within the surface regions 12. Thus, a series of forty transistor "cells" are formed, the P type bulk material of the wafer 10 providing a common collector electrode. Each of the N type surface regions 12 forms the base electrode of a cell, with the contained P type region 13 forming the emitter electrode for that cell. All of the surface regions 12 are formed by the same diffusion process, as are all of the surface regions 13, whereby all of the cells have identical electrical characteristics.

Then a coating 15 of electrical insulating material, such as a sterile oxide film, for example, is established on the wafer 10, completely covering the upper surface 11. In accordance with well known masking and etching techniques, certain portions of the oxide coating 15 are removed to expose predetermined portions of the surface regions 12 and 13. In the illustrated embodiment an elongate central strip portion of each of the P type surface regions 13 is exposed, as are central strip portions of each N type region 12, with one elongate portion of each N type region 12 being exposed on either side of the associated P type region 13. Thus, none of the junctions are exposed and electrical contact to the various surface regions in each cell is facilitated.

Next, a film of electroconductive material is established in a predetermined pattern upon the oxide coating 15 and covering the exposed surface portions of the underlying semiconductor wafer. This electroconductive pattern may be formed by any metalizing technique, the predetermined pattern defining two separate concentric electrical contact configurations. The innermost portion of the pattern defines a base contact generally indicated by the reference numeral 20, the outermost portion of the pattern defining a surrounding emitter contact generally indicated by the reference numeral 30. These base and emitter contacts can best be described with reference to FIGURES 4–6 of the drawing.

The base contact 20 defines an innermost central disc portion **20*a* and an outermost ring portion 20*b* interconnected by a plurality of linear interconnecting portions 20*c*, not unlike the spokes of a wheel. Each of the interconnecting portions 20*c* extends radially from the innermost central disc portion to a point on the outermost ring portion equidistant from two adjacent surface regions 12 defining the transistor cells. The outermost ring portion 20*b* further defines a series of U-shaped projections including fingers 21, extending radially outward over the openings in the oxide coating 15 over the N type base regions 12**, the metal filling these openings to thereby establish ohmic contact with the surface regions as can best be seen in FIGURES 5 and 6 of the drawing.

The emitter contact 30 comprises an outer ring portion **30*a* and a series of radially inwardly projecting linear portions 30*b*. Each of the projecting portions 30*b* defines a finger which extends over a different one of the P type surface regions 13, the finger covering the opening in the oxide coating and filling the opening to thereby establish ohmic contact with the exposed P type semiconductor material of the emitter contact. As can best be seen in FIGURE 5, each of the linear portions 30*b* extends into the opening defined by the U-shaped fingers 21. Therefore, the emitter contact 30 is in ohmic contact with each of the P type surface regions 13 and is electrically insulated from the N type surface regions 12 and the remainder of the semiconductor wafer by the oxide coating 15, and from the base contact 20 by physical spacing. Although, as a matter of convenience, the base and emitter contacts 20 and 30** can be formed by one metalizing operation, these contacts can be formed by a series of separate metalizing operations.

External electrical connection to the parallel connected base electrodes is made by bonding a base lead to the central disc portion **20*a* of the base contact, external emitter connection being established by bonding an emitter lead to the outer ring portion 30*a* of the emitter contact. External connection to the collector electrode can be made conveniently to the bottom surface of the semiconductor wafer 10, the bottom surface being metalized to facilitate low resistance ohmic connection thereto. The arrangement of the linear interconnecting portions 20*c*** of the base contact insures an identical minimum base lead length for each of the transistor cells, the base leads being symmetrical and equidistantly spaced between adjacent cells. Thus, both the D.C. and R.F. signals are fed uniformly to each cell through the use of this symmetrical base pattern, and each cell draws the same amount of current. The illustrated forty cell embodiment has been fabricated to provide a 50 watt transistor for operation at 150 megacycles, with a gain on the order of 7 db and typical efficiencies of 65–75 percent.

Although the present invention has been described with a certain degree of particularity, it is understood that the present disclosure has been made only by way of example and that numerous changes in the combination and arrangement of parts may be resorted to without departing from the spirit and scope of the invention as hereinafter claimed. For example, the present invention technique is equally applicable in the fabrication of other types of multiple cell semiconductor devices wherein the cells are interconnected in parallel. Also, it is readily apparent that any number of such cells can be fabricated in a unitary structure, utilizing the present invention base interconnection technique.

What is claimed is:

1. In a semiconductor device:

(a) a semiconductor body of a first predetermined conductivity type defining a substantially planar surface;

(b) a plurality of substantially identical first elongate surface regions of a second predetermined conductivity type in said planar surface of said semiconductor body, said first elongate surface regions being disposed to form a circular array and equidistantly spaced;

(c) a plurality of second surface regions of said first predetermined conductivity type, one each of said second surface regions being disposed within a different one of said first surface regions, the depth of each of said second surface regions being less than the depth of the first surface region within which it is disposed;

(d) a layer of electrical insulating material established on said planar surface of said semiconductor body and exposing identical portions of said first surface regions;

(e) a thin layer of electroconductive material established in a predetermined pattern on said layer of electrical insulating material, said predetermined pattern defining a disc shaped first portion at the center of said circular array, an annular second portion in ohmic contact with the exposed identical portions of said first surface regions and defining a path extending between each two adjacent first surface regions, each of said paths being of identical length, and a plurality of elongate third portions of identical length, each of said elongate third portions interconnecting said disc shaped first portion with a point midway on a different one of said paths defined by said annular second portion between two adjacent first surface regions; and, (f) means for establishing electrical contact to the disc shaped first portion of said layer of electroconductive material.

2. In a semiconductor device:

(a) a semiconductor body of a first predetermined conductivity type defining a substantially planar surface;

(b) a plurality of substantially identical first elongate surface regions of a second predetermined conductivity type in said planar surface of said semiconductor body, said first elongate surface regions being symmetrically disposed in radial alignment to form a circular array;

(c) a plurality of second surface regions of said first predetermined conductivity type, one each of said second surface regions being disposed within a different one of said first surface regions, the depth of each of said second surface regions being less than the depth of the first surface region within which it is disposed;

(d) a layer of electrical insulating material established on said planar surface of said semiconductor body and exposing identical portions of said first surface regions;

(e) a thin layer of electroconductive material established in a predetermined pattern on said layer of electrical insulating material, said predetermined pattern defining a disc shaped first portion at the center of said circular array, an annular second portion in ohmic contact with the exposed identical portions of said first surface regions and defining a path extending between each two adjacent first surface regions, each of said paths being of identical length, and a plurality of elongate third portions of identical length, each of said elongate third portions interconnecting said disc shaped first portion with a point midway on a different one of said paths defined by said annular second portion between two adjacent first surface regions; and, (f) means for establishing electrical contact to the disc shaped first portion of said layer of electroconductive material.

3. In a semiconductor device:

(a) a semiconductor body of a first predetermined conductivity type defining a substantially planar surface;

(b) a plurality of substantially identical first elongate surface regions of a second predetermined conductivity type in said planar surface of said semiconductor body, said first elongate surface regions being symmetrically disposed in radial alignment to form a circular array;

(c) a plurality of second surface regions of said first predetermined conductivity type, one each of said second surface regions being disposed within a different one of said first surface regions, the depth of each of said second surface regions being less than the depth of the first surface region within which it is disposed;

(d) a layer of electrical insulating material established on said planar surface of said semiconductor body and exposing identical portions of said first surface regions;

(e) a thin layer of electroconductive material established in a predetermined pattern on said layer of electrical insulating material, said predetermined pattern defining a disc shaped first portion at the center of said circular array, an annular portion in ohmic contact with the exposed identical portions of said first elongate surface regions and defining a path extending between each two adjacent first surface regions, each of said paths being of identical length, and a plurality of straight line third portions of identical length, each of said straight line third portions interconnecting said disc shaped first portion with a point midway on a different one of said paths defined by said annular second portion between two adjacent first surface regions; and, (f) means for establishing electrical contact to the disc shaped first portion of said layer of electroconductive material.

4. In a semiconductor device:

(a) a semiconductor body of a first predetermined conductivity type defining a substantially planar surface;

(b) a plurality of substantially identical first elongate surface regions of a second predetermined conductivity type in said planar surface of said semiconductor body, said first elongate surface regions being symmetrically disposed in radial alignment to form a circular array;

(c) a plurality of second surface regions of said first predetermined conductivity type, one each of said second surface regions being disposed within a different one of said first surface regions, the depth of each of said second surface regions being less than the depth of the first surface region within which it is disposed;

(d) a layer of electrical insulating material established on said planar surface of said semiconductor body and exposing identical portions of said first surface regions;

(e) a thin layer of electroconductive material established in a predetermined pattern on said layer of electrical insulating material, said predetermined pattern defining a disc shaped portion at the center of said circular array, a concentric ring portion in ohmic contact with the exposed identical portions of said first elongate surface regions, and a plurality of identical linear interconnecting portions, each of said interconnecting portions extending radially from said disc shaped portion to a different point on said annular ring portion equidistant from two adjacent elongate first surface regions, each of said interconnecting portions being of identical length; and (f) means for establishing electrical contact to the disc shaped portion of said layer of electroconductive material.

5. In a semiconductor device:

(a) a semiconductor wafer of a first predetermined conductivity type defining a substantially planar upper surface;

(b) a predetermined plurality of substantially identical elongate rectangular first surface regions of a second predetermined conductivity type in the upper surface of said semiconductor wafer, said elongate rectangular first surface regions being symmetrically disposed in radial alignment to form a circular array;

(c) a predetermined plurality of substantially identical elongate rectangular second surface regions of said first predetermined conductivity type, one each of said second surface regions being centrally disposed within a different one of said first surface regions and equidistant from the center of said circular array, the depth of each of said second surface regions being less than the depth of the first surface region within which it is disposed;

(d) a layer of electrical insulating material established on the upper surface of said semiconductor wafer and exposing identical portions of said first surface regions;

(e) a thin layer of electroconductive material established in predetermined pattern on said layer of electrical insulating material, said predetermined pattern defining a disc portion at the center of said circular array, a concentric ring portion in ohmic contact with the exposed identical portions of said first surface regions, and a plurality of identical straight line interconnecting portions, each of said interconnecting portions extending radially from said disc portion to a different point on said concentric ring portion equidistant from two adjacent first surface regions; and, (f) means for establishing electrical contact to the disc portion of said layer of electroconductive material.

6. In a semiconductor device:
(a) a semiconductor wafer of a first predetermined conductivity type defining a substantially planar upper surface;
(b) a predetermined plurality of substantially identical elongate rectangular first surface regions of a second predetermined conductivity type in the upper surface of said semiconductor wafer, said elongate rectangular first surface regions being symmetrically disposed in radial alignment to form a circular array;
(c) a predetermined plurality of substantially identical elongate rectangular second surface regions of said first predetermined conductivity type, one each of said second surface regions being centrally disposed within a different one of said first surface regions and equidistant from the center of said circular array, the depth of each of said second surface regions being less than the depth of the first surface region within which it is disposed;
(d) a layer of electrical insulating material established on the upper surface of said semiconductor wafer and exposing the innermost end portion of each of said elongate rectangular first surface regions;
(e) a thin layer of electroconductive material established in a predetermined pattern on said layer of electrical insulating material, said predetermined pattern defining a central disc portion at the center of said circular array, a concentric ring portion in ohmic contact with the exposed identical portions of said first surface regions, and a plurality of identical straight line interconnecting portions, each of said interconnecting portions extending radially from said disc portion to a different point on said concentric ring portion equidistant from two adjacent first surface regions; and,
(f) means for establishing electrical contact to the central disc portion of said layer of electroconductive material.

7. A semiconductor device comprising:
(a) a semiconductor wafer of a first predetermined conductivity type defining a substantially planar upper surface;
(b) a predetermined plurality of substantially identical elongate rectangular first surface regions of a second predetermined conductivity type in the upper surface of said semiconductor wafer, said elongate rectangular first surface regions being symmetrically disposed in radial alignment to form a circular array;

(c) a predetermined plurality of substantially identical elongate rectangular second surface regions of said first predetermined conductivity type, one each of said second surface regions being centrally disposed within a different one of said first surface regions and equidistant from the center of said circular array, the depth of each of said second surface regions being less than the depth of the first surface region within which it is disposed;
(d) a layer of electrical insulating material established on the upper surface of said semiconductor wafer and exposing the innermost end portions of said first surface regions and the outermost end portions of said second surface regions;
(e) a thin layer of electroconductive material established in a predetermined pattern on said layer of electrical insulating material, said predetermined pattern defining a disc portion at the center of said circular array, a first concentric ring portion in ohmic contact with the exposed innermost end portions of said first surface regions, a plurality of identical straight line interconnecting portions, each of said interconnecting portions extending radially from said disc portion to a different point on said first concentric ring portion equidistant from two adjacent first surface regions, and a second concentric ring portion in ohmic contact with the exposed outermost end portions of said second surface regions, said second concentric ring portion being electrically insulated from the remainder of said layer of electroconductive material;
(f) means for establishing electrical contact to the disc portion of said layer of electroconductive material;
(g) means for establishing electrical contact to the second concentric ring portion of said layer of electroconductive material; and
(h) means for establishing electrical contact to the bulk material of said first predetermined conductivity type of said semiconductor wafer.

References Cited

UNITED STATES PATENTS

| | | | |
|---|---|---|---|
| 3,225,261 | 12/1965 | Wolf | 317—101 |
| 3,271,640 | 9/1966 | Moore | 317—235 |

ROBERT K. SCHAEFER, *Primary Examiner.*

D. SMITH, Jr., *Assistant Examiner.*